(12) United States Patent
Lu

(10) Patent No.: US 8,497,793 B2
(45) Date of Patent: Jul. 30, 2013

(54) ANALOG-TO-DIGITAL CONVERTER WITH DELTA-SIGMA MODULATION AND MODULATION UNIT THEREOF

(75) Inventor: Wu-Hung Lu, New Taipei (TW)

(73) Assignee: Via Telecom, Inc., San Diego, CA (US)

( * ) Notice: Subject to any disclaimer, the term of this patent is extended or adjusted under 35 U.S.C. 154(b) by 19 days.

(21) Appl. No.: 13/418,232

(22) Filed: Mar. 12, 2012

(65) Prior Publication Data

US 2013/0169459 A1 Jul. 4, 2013

(30) Foreign Application Priority Data

Dec. 31, 2011 (CN) .......................... 2011 1 0459404

(51) Int. Cl.
*H03M 3/00* (2006.01)
(52) U.S. Cl.
USPC .......................................... 341/143; 341/155
(58) Field of Classification Search
USPC .................................................. 341/143, 155
See application file for complete search history.

(56) References Cited

U.S. PATENT DOCUMENTS

| | | | |
|---|---|---|---|
| 5,623,216 A | 4/1997 | Penza et al. | |
| 5,745,060 A * | 4/1998 | McCartney et al. | 341/120 |
| 6,064,230 A | 5/2000 | Singh | |
| 6,593,865 B2 * | 7/2003 | Nestler et al. | 341/141 |
| 7,205,920 B2 | 4/2007 | Morrow et al. | |
| 7,315,200 B2 * | 1/2008 | Holberg et al. | 327/554 |
| 7,429,941 B1 * | 9/2008 | Draxelmayr et al. | 341/143 |
| 7,656,201 B2 | 2/2010 | Kanzaki | |
| 7,825,838 B1 | 11/2010 | Srinivas et al. | |
| 2005/0162296 A1 * | 7/2005 | Koe et al. | 341/143 |
| 2005/0219065 A1 * | 10/2005 | Holberg et al. | 341/1 |

\* cited by examiner

*Primary Examiner* — Jean B Jeanglaude

(74) *Attorney, Agent, or Firm* — McClure, Qualey & Rodack, LLP

(57) ABSTRACT

An analog-to-digital converter with delta-sigma modulation and the modulation unit thereof are disclosed, wherein, for each modulation unit, a pair of input capacitors, a pair of integration capacitors and a differential feedback are operated in a swapping manner for the positive path and the negative path, such that circuit mismatch problems are effectively removed.

20 Claims, 3 Drawing Sheets

ANALOG-TO-DIGITAL CONVERTER WITH DELTA-SIGMA MODULATION AND MODULATION UNIT THEREOF

CROSS REFERENCE TO RELATED APPLICATIONS

This application claims priority of China Patent Application No. 201110459404.3, filed on Dec. 31, 2011, the entirety of which is incorporated by reference herein.

BACKGROUND OF THE INVENTION

1. Field of the Invention

The present invention relates to analog-to-digital converters, and in particular relates to circuit mismatch problems of analog-to-digital converters using delta-sigma modulation.

2. Description of the Related Art

Delta-sigma modulation is generally used in analog-to-digital converters. The differential pair architecture of the delta-sigma modulation design helps to suppress power supply noise and reduce circuit nonlinearity.

In the differential pair architecture, a matching circuit design is especially important. The way to cope with circuit mismatch problems of the differential pair architecture is an important issue in the circuit design field.

BRIEF SUMMARY OF THE INVENTION

An analog-to-digital converter with delta-sigma modulation and the modulation unit thereof are disclosed.

An analog-to-digital converter with delta-sigma modulation in accordance with an exemplary embodiment of the invention comprises a modulation unit and a comparator.

The modulation unit comprises a first input capacitor, a second input capacitor, an operational amplifier, a first integration capacitor, a second integration capacitor, and a feedback control circuit.

The first input capacitor and the second input capacitor sample a first input signal and a second input signal in a swapping manner.

The operational amplifier has a first input terminal, a second input terminal, a first output terminal and a second output terminal. A first output signal and a second output signal of the modulation unit are obtained from the first output terminal and the second output terminal of the operational amplifier, respectively.

The first integration capacitor is coupled between the first input terminal and the first output terminal of the operational amplifier. The second integration capacitor is coupled between the second input terminal and the second output terminal of the operational amplifier. The first and second integration capacitors are coupled to the first and second input capacitors in a swapping manner.

The feedback control circuit is operative to generate a first feedback amount and a second feedback amount which are coupled to the first integration capacitor and the second integration capacitor in a swapping manner.

The comparator has a non-inverted input terminal and an inverted input terminal coupled to receive the first and second output signals of the modulation unit, respectively, and further has an output terminal providing a digital signal. The output terminal of the comparator is further coupled to the feedback control circuit to control the first and second feedback amounts.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
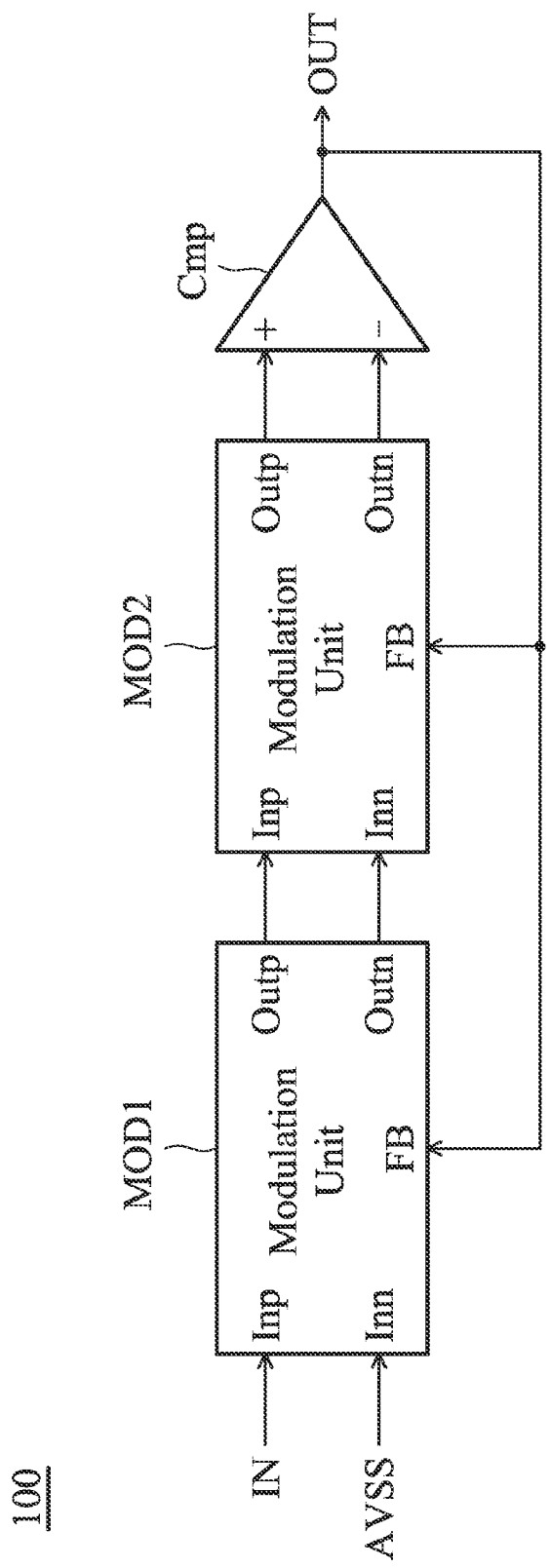
FIG. 1 depicts an analog-to-digital converter 100 in accordance with an exemplary embodiment of the invention, which adopts a delta-sigma modulation technique.

FIG. 1 depicts an analog-to-digital converter 100 in accordance with an exemplary embodiment of the invention, which adopts a delta-sigma modulation technique.

After being input to the analog-to-digital converter 100, an analog signal IN is processed by a differential architecture provided by a modulation design which consists at least one modulation unit (herein, two modulation stages are shown, including a first stage modulation unit MOD1 and a second stage modulation unit MOD2), and then is transformed to a digital signal OUT by a comparator cmp. In other exemplary embodiments, the comparator cmp may be further coupled to a low-pass filter or other devices.

As shown, to form a differential architecture, each of the modulation units (MOD1, MOD2) is designed to have a first input terminal Inp, a second input terminal Inn, a first output terminal Outp and a second output terminal Outn. As for the first stage modulation unit MOD1, the first input terminal Inp receives the analog signal IN, the second input terminal Inn is coupled to an analog ground AVSS, and the first and second output terminals Outp and Outn are coupled to the first and second input terminals Inp and Inn of the second stage modulation unit MOD2, respectively. As for the modulation unit MOD2 which is at the last stage, the first output terminal Outp and the second output terminal Outn thereof are coupled to a non-inverted input terminal (labeled as '+') and an inverted input terminal (labeled as '−') of the comparator cmp, respectively. The comparator cmp converts the differential input to a signal end output, which is the digital signal OUT.

Furthermore, considering an upper limit of integration, the modulation unit (e.g. MOD1 or MOD2) further has a feedback terminal FB. The output terminal of the comparator cmp (hereinafter the output terminal of the comparator cmp is also labeled as OUT) is further coupled to the feedback terminals FB of the modulation units (MOD1 and MOD2) for negative feedback control.

Figure 2A:
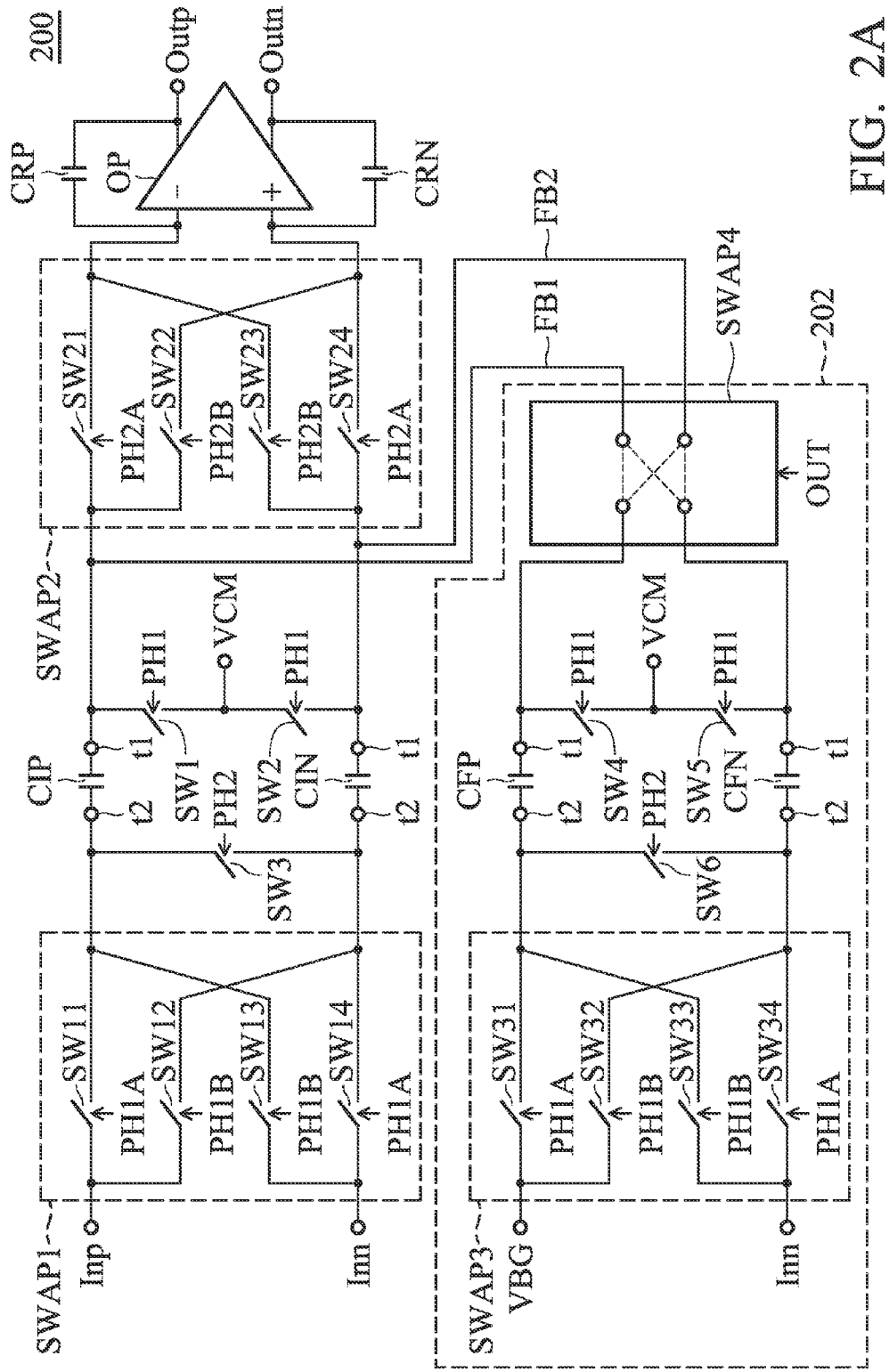
FIG. 2A depicts a modulation unit (e.g. MOD1 or MOD2 of FIG. 1) in accordance with an exemplary embodiment of the invention.

FIG. 2A illustrates an exemplary embodiment of the modulation unit (e.g. MOD1 or MOD2). The core technology of the modulation unit 200 shown in FIG. 2A is discussed in the following paragraphs.

The first input capacitor CIP and the second input capacitor CIN sample a first input signal at the first input terminal Inp and a second input signal at the second input terminal Inn of the modulation unit 200 in a swapping manner. Hereinafter, the first input signal is also labeled as Inp and the second input signal is also labeled as Inn.

The operational amplifier OP has a first input terminal (labeled as '−'), a second input terminal (labeled as '+'), a first output terminal, and a second output terminal. A first output signal and a second output signal of the modulation unit 200 are obtained from the first and second output terminals of the operational amplifier OP. Hereinafter, the first output signal and the second output signal are labeled as Outp and Outn, respectively, which are the same as the symbols for the first and second output terminals of the modulation unit 200. The first integration capacitor CRP is coupled between the first input terminal '−' and the first output terminal of the operational amplifier OP. The second integration capacitor CRN is coupled between the second input terminal '+' and the second output terminal of the operational amplifier OP. The first and second integration capacitors CRP and CRN are coupled to the first and second input capacitors CIP and CIN in a swapping manner.

The feedback control circuit 202 generates a first feedback amount FB1 and a second feedback amount FB2, which are coupled to the first integration capacitor CRP and the second integration capacitor CRN in a swapping manner. The output terminal OUT (referring to FIG. 1) of the comparator cmp of the analog-to-digital converter 100 is fed back to the feedback control circuit 202 of FIG. 2 to control the first and second feedback amounts FB1 and FB2.

To sum up, the input capacitor pair (the first and second input capacitors CIP and CIN), the integration capacitor pair (the first and second integration capacitors CRP and CRN) and the differential feedback design (involving the first and second feedback amounts FB1 and FB2) are all operated in a swapping manner, such that circuits forming a positive path initially will be switched to form a negative path later and circuits forming a negative path initially will be switched to form a positive path later. In this manner, the circuit mismatch problems can be effectively solved.

The circuit of the modulation unit 200 is detailed in the following paragraphs.

First, the feedback control circuit 202 is discussed. In the disclosure, the first feedback amount FB1 and the second feedback amount FB2 generated by the feedback control circuit 202 are coupled to the first integration capacitor CRP and the second integration capacitor CRN in a swapping manner. Further, the feedback control circuit 202 also samples signals in a swapping manner. As shown, the feedback control circuit 202 has a first feedback capacitor CFP and a second feedback capacitor CFN. The capacitors CFP and CFN sample a reference voltage VBG (e.g. a bandgap voltage) and the second input signal Inn in a swapping manner.

This paragraph shows how the signal at the output terminal OUT (referring to FIG. 1) of the comparator cmp of the analog-to-digital converter 100 controls the first and second feedback amounts FB1 and FB2. When a signal at the output terminal OUT is at a first state (e.g. '1'), the first feedback capacitor CFP and the second feedback capacitor CFN provide the first feedback amount FB1 and the second feedback amount FB2, respectively. When the signal of the output terminal OUT is at a second state (e.g. '0'), the first feedback capacitor CFP and the second feedback capacitor CFN provide the second feedback amount FB2 and the first feedback amount FB1, respectively. The feedback control according to the signal at the output terminal OUT can avoid the situation where the integrator exceeds the upper integration limit.

The sampling circuit which samples the first and second input signals Inp and Inn by the first and second input capacitors CIP and CIN is discussed in this paragraph. As shown, a first switch SW1 and a second switch SW2 are turned on in an input phase PH1 to couple a first terminal t1 of the first input capacitor CIP to a common mode voltage node VCM and couple a first terminal t1 of the second input capacitor CIN to the common mode voltage node VCM. A first connection-swap circuit SWAP1 is configured to couple the first input signal Inp to a second terminal t2 of the first input capacitor CIP and couple the second input signal Inn to a second terminal t2 of the second input capacitor CIN in a first half-frequency phase PH1A of an input phase PH1, and couple the first input signal Inp to the second terminal t2 of the second input capacitor CIN and couple the second input signal Inn to the second terminal t2 of the first input capacitor CIP in a second half-frequency phase PH1B of the input phase PH1.

Referring to the exemplary embodiment of FIG. 2A, the first connection swap circuit SWAP1 may comprise four connection swap switches SW11, SW12, SW13 and SW14. The connection swap switch SW11 is turned on in the first half-frequency phase PH1A of the input phase PH1, to couple the first input signal Inp to the second terminal t2 of the first input capacitor CIP. The connection swap switch SW12 is turned on in the second half-frequency phase PH1B of the input phase PH1, to couple the first input signal Inp to the second terminal t2 of the second input capacitor CIN. The connection swap switch SW13 is turned on in the second half-frequency phase PH1B of the input phase PH1, to couple the second input signal Inn to the second terminal t2 of the first input capacitor CIP. The connection swap switch SW14 is turned on in the first half-frequency phase PH1A of the input phase PH1, to couple the second input signal Inn to the second terminal t2 of the second input capacitor CIN.

The integration design of the first and second integration capacitors CRP and CRN is discussed in detail in this paragraph. As shown, a third switch is designed to be turned on in an integration phase PH2, to couple the second terminal t2 of the first input capacitor CIP to the second terminal t2 of the second input capacitor CIN. A second connection swap circuit SWAP2 is configured to couple the first terminal t1 of the first input capacitor CIP to the first input terminal '−' of the operational amplifier OP and couple the first terminal t1 of the second input capacitor CIN to the second input terminal '+' of the operational amplifier OP in a first half-frequency phase PH2A of the integration phase PH2 and, in a second half-frequency phase PH2B of the integration phase PH2, the second connection swap circuit SWAP2 couples the first terminal t1 of the first input capacitor CIP to the second input terminal '+' of the operational amplifier OP and couples the first terminal t1 of the second input capacitor CIN to the first input terminal '−' of the operational amplifier OP.

Referring to the exemplary embodiment shown in FIG. 2A, the second connection swap circuit SWAP2 may comprises four connection swap switches SW21, SW22, SW23 and SW24. The connection swap switch SW21 is turned on in the first half-frequency phase PH2A of the integration phase PH2, to couple the first terminal t1 of the first input capacitor CIP to the first input terminal '−' of the operational amplifier OP. The connection swap switch SW22 is turned on in the second half-frequency phase PH2B of the integration phase PH2, to couple the first terminal t1 of the first input capacitor CIP to the second input terminal '+' of the operational amplifier OP. The connection swap switch SW23 is turned on in the second half-frequency phase PH2B of the integration phase PH2, to couple the first terminal t1 of the second input capacitor CIN to the first input terminal '−' of the operational amplifier OP. The connection swap switch SW24 is turned on in the first half-frequency phase PH2A of the integration phase PH2, to couple the first terminal t1 of the second input capacitor CIN to the second input terminal '+' of the operational amplifier OP.

The circuit for sampling the reference voltage VBG and the second input signal Inn to the first and second feedback capacitors CFP and CFN is discussed in detail in this paragraph. As shown, a fourth switch SW4 and a fifth switch SW5 are designed to be turned on in the input phase PH1, to couple a first terminal t1 of the first feedback capacitor CFP to the common mode voltage node VCM and couple a first terminal t1 of the second feedback capacitor CFN to the common mode voltage node VCM. A third connection swap circuit SWAP3 is configured to couple the reference voltage VBG to a second terminal t2 of the first feedback capacitor CFP and couple the second input signal Inn to a second terminal t2 of the second feedback capacitor CFN in the first half-frequency phase PH1A of the input phase PH1 and, in the second half-frequency PH1B of the input phase PH1, the third connection swap circuit SWAP3 couples the reference voltage VBG to the second terminal t2 of the second feedback capacitor CFN and couples the second input signal Inn to the second terminal t2 of the first feedback capacitor CFP.

Referring to the exemplary embodiment shown in FIG. 2A, the third connection swap circuit SWAP3 may comprise four connection swap switches SW31, SW32, SW33 and SW34. The connection swap switch SW31 is turned on in the first half-frequency phase PH1A of the input phase PH1, to couple the reference voltage VBG to the second terminal t2 of the first feedback capacitor CFP. The connection swap switch SW32 is turned on in the second half-frequency phase PH1B the input phase PH1, to couple the reference voltage VBG to the second terminal t2 of the second feedback capacitor CFN. The connection swap switch SW33 is turned on in the second half-frequency phase PH1B of the input phase PH1, to couple the second input signal Inn to the second terminal t2 of the first feedback capacitor CFP. The connection swap switch SW34 is turned on in the first half-frequency phase PH1A of the input phase PH1, to couple the second input signal Inn to the second terminal t2 of the second feedback capacitor CFN.

The design of FIG. 2A further comprises a sixth switch SW6 which is turned on in the integration phase PH2 to couple the second terminal t2 of the first feedback capacitor CFP to the second terminal t2 of the second feedback capacitor CFN. As for how to use the first and second feedback capacitors CFP and CFN to provide the first and second feedback amounts FB1 and FB2 for integration, a fourth connection swap circuit SWAP4 is disclosed in the exemplary embodiment of FIG. 2A. The fourth connection swap circuit SWAP4 is controlled by the signal at the output terminal OUT (referring to FIG. 1) of the comparator cmp of the analog-to-digital converter 100. When the signal at the output terminal OUT is in a first state '1', the fourth connection swap circuit SWAP4 obtains the first feedback amount FB1 from the first terminal t1 of the first feedback capacitor CFP and obtains the second feedback amount FB2 from the first terminal t1 of the second feedback capacitor CFN. When the signal at the output terminal OUT is at a second state '0', the fourth connection swap circuit SWAP4 obtains the first feedback amount FB1 from the first terminal t1 of the second feedback capacitor CFN and obtains the second feedback amount FB2 from the first terminal of the first feedback capacitor CFP.

Figure 2B:
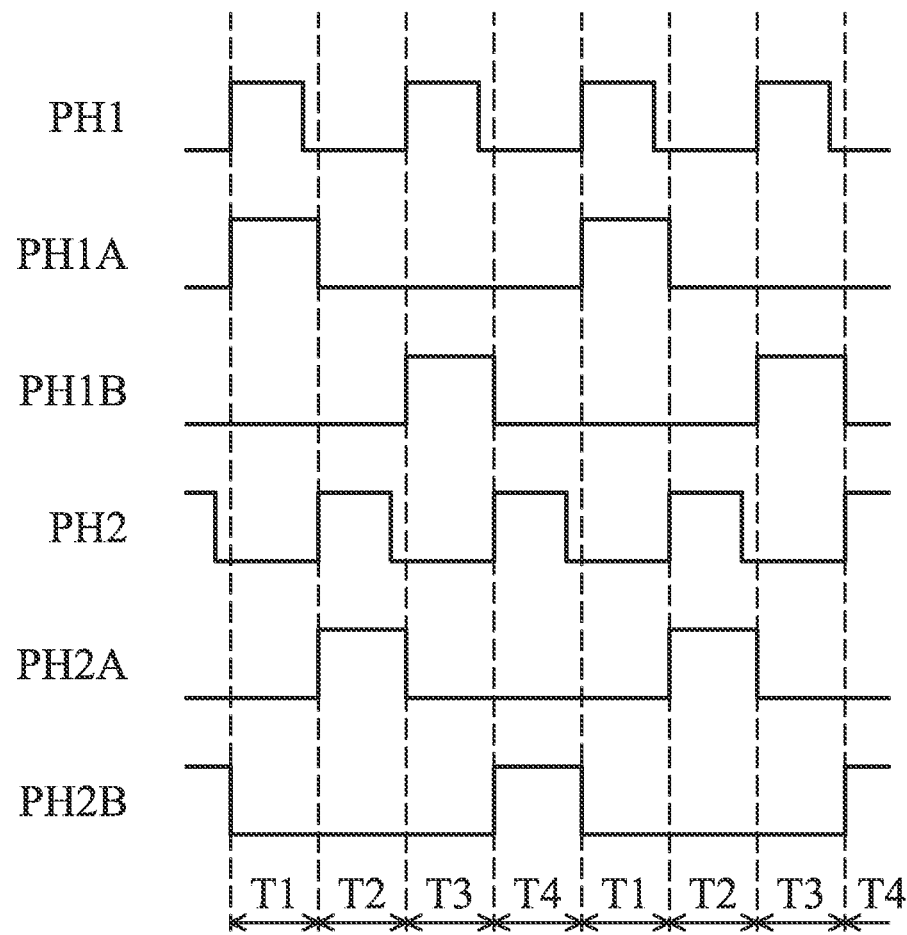
FIG. 2B shows waveforms depicting an input phase PH1 and first and second half-frequency phases PH1A and PH1B corresponding thereto and an integration phase PH2 and first and second half-frequency phases PH2A and PH2B corresponding thereto.

FIG. 2B shows waveforms depicting the input phase PH1 and the first and second half-frequency phases PH1A and PH1B corresponding thereto and the integration phase PH2 and the first and second half-frequency phases PH2A and PH2B corresponding thereto. The input phase PH1 and the integration phase PH2 are enabled in a staggered fashion, operated at identical frequencies but enabled at different times. As for the input phase PH1, the first and second half-frequency phases PH1A and PH1B corresponding thereto are operated at half-frequency of the input phase PH1, and the active regions of the first half-frequency phase PH1A do not overlap the active regions of the second half-frequency phase PH1B. Considering the parasitic capacitors of the circuit, the phases PH1A and PH1B are disabled after the input phase PH1 have been disabled. As for the integration phase PH2, the first and second half-frequency phases PH2A and PH2B corresponding thereto are operated at half-frequency of the integration phase PH2, and the active regions of the first half-frequency phase PH2A do not overlap the active regions of the second half-frequency phase PH2B. Considering the parasitic capacitors of the circuit, the phases PH2A and PH2B are disabled after the integration phase PH2 has been disabled.

Note that the first and second half-frequency phases PH1A and PH1B are operated at half frequency of the input phase PH1 and the first and second half-frequency phases PH2A and PH2B are operated at half frequency of the integration phase PH2—the input phase PH1 and the integration phase PH2 are operated at the highest frequency compared to other components in the disclosed circuit. In this disclosure, it is not required to double the operating frequency of the input phase PH1 and the integration phase PH2 for speeding up charge accumulation. For high frequency circuits, a design having no frequency doubler is more superior.

To sum up, the disclosed modulation unit is operated in four modes: a first input/feedback mode T1, a first integration mode T2, a second input/feedback mode T3 and a second integration mode T4. The input/feedback operation of the disclosed circuit is repeatedly switched between the first input/feedback mode T1 and the second input/feedback mode T3. The integration operation of the disclosed circuit is repeatedly switched between the first integration mode T2 and the second integration mode T4. In this manner, the input capacitor pair, the integration capacitor pair, and the differential feedback circuit are operated in a swapping manner, wherein circuits forming a positive path initially will be switched to form a negative path later and circuits forming a negative path initially will be switched to form a positive path later. In this manner, the circuit mismatch problems can be effectively solved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter with delta-sigma modulation, comprising:
   at least one modulation unit, comprising:
      a first input capacitor and a second input capacitor, sampling a first input signal and a second input signal in a swapping manner;
      an operational amplifier, having a first input terminal, a second input terminal, a first output terminal and a second output terminal, wherein the first and second output terminals are operative to output a first output signal and a second output signal of the modulation unit, respectively;

a first integration capacitor coupled between the first input terminal and the first output terminal of the operational amplifier, and a second integration capacitor coupled between the second input terminal and the second output terminal of the operational amplifier, wherein the first and second integration capacitors are coupled to the first and second input capacitors in a swapping manner; and a feedback control circuit, generating a first feedback amount and a second feedback amount to be coupled to the first integration capacitor and the second integration capacitor in a swapping manner; and a comparator, having a non-inverted input terminal and an inverted input terminal coupled to the first and second output signals of the modulation unit, respectively, and further having an output terminal operative to output a digital signal, wherein the output terminal of the comparator is further coupled to the feedback control circuit to control the first and second feedback amounts.

2. The analog-to-digital converter as claimed in claim 1, wherein the feedback control circuit comprises:

a first feedback capacitor and a second feedback capacitor, sampling a reference voltage and the second input signal in a swapping manner, wherein when a signal at the output terminal of the comparator is at a first state, the first and second feedback capacitors are used to provide the first feedback amount and the second feedback amount, respectively, and, when the signal at the output terminal of the comparator is at a second state, the first and second feedback capacitors are used to offer the second feedback amount and the first feedback amount, respectively.

3. The analog-to-digital converter as claimed in claim 2, comprising:

a first switch and a second switch, turned on in an input phase to couple a first terminal of the first input capacitor to a common mode voltage node and couple a first terminal of the second input capacitor to the common mode voltage node; and a first connection swap circuit, coupling the first input signal to a second terminal of the first input capacitor and coupling the second input signal to a second terminal of the second input capacitor in a first half-frequency phase of the input phase, and coupling the first input signal to the second terminal of the second input capacitor and coupling the second input signal to the second terminal of the first input capacitor in a second half-frequency phase of the input phase.

4. The analog-to-digital converter as claimed in claim 3, wherein the first connection swap circuit comprises:

a first connection swap switch, turned on in the first half-frequency phase of the input phase to couple the first input signal to the second terminal of the first input capacitor;

a second connection swap switch, turned on in the second half-frequency phase of the input phase to couple the first input signal to the second terminal of the second input capacitor;

a third connection swap switch, turned on in the second half-frequency phase of the input phase to couple the second input signal to the second terminal of the first input capacitor; and a fourth connection swap switch, turned on in the first half-frequency phase of the input phase to couple the second input signal to the second terminal of the second input capacitor.

5. The analog-to-digital converter as claimed in claim 3, comprising:

a third switch, turned on in an integration phase to couple the second terminal of the first input capacitor to the second terminal of the second input capacitor; and a second connection swap circuit, coupling the first terminal of the first input capacitor to the first input terminal of the operational amplifier and coupling the first terminal of the second input capacitor to the second input terminal of the operational amplifier in a first half-frequency phase of the integration phase, and coupling the first terminal of the first input capacitor to the second input terminal of the operational amplifier and coupling the first terminal of the second input capacitor to the first input terminal of the operational amplifier in a second half-frequency phase of the integration phase.

6. The analog-to-digital converter as claimed in claim 5, wherein the second connection swap circuit comprises:

a first connection swap switch, turned on in the first half-frequency phase of the integration phase to couple the first terminal of the first input capacitor to the first input terminal of the operational amplifier;

a second connection swap switch, turned on in the second half-frequency phase of the integration phase to couple the first terminal of the first input capacitor to the second terminal of the operational amplifier;

a third connection swap switch, turned on in the second half-frequency phase of the integration phase to couple the first terminal of the second input capacitor to the first input terminal of the operational amplifier; and a fourth connection swap switch, turned on in the first half-frequency phase of the integration phase to couple the first terminal of the second input capacitor to the second input terminal of the operational amplifier.

7. The analog-to-digital converter as claimed in claim 5, comprising:

a fourth switch and a fifth switch, turned on in the input phase to couple a first terminal of the first feedback capacitor to the common mode voltage node and couple a first terminal of the second feedback capacitor to the common mode voltage node; and a third connection swap circuit, coupling the reference voltage to a second terminal of the first feedback capacitor and coupling the second input signal to a second terminal of the second feedback capacitor in the first half-frequency phase of the input phase, and coupling the reference voltage to the second terminal of the second feedback capacitor and coupling the second input signal to the second terminal of the first feedback capacitor in the second half-frequency phase of the input phase.

8. The analog-to-digital converter as claimed in claim 7, wherein the third connection swap circuit comprises:

a first connection swap switch, turned on in the first half-frequency phase of the input phase to couple the reference voltage to the second terminal of the first feedback capacitor;

a second connection swap switch, turned on in the second half-frequency phase of the input phase to couple the reference voltage to the second terminal of the second feedback capacitor;

a third connection swap switch, turned on in the second half-frequency phase of the input phase to couple the second input signal to the second terminal of the first feedback capacitor; and a fourth connection swap switch, turned on in the first half-frequency phase of the input phase to couple the second input signal to the second terminal of the second feedback capacitor.

9. The analog-to-digital converter as claimed in claim 7, comprising:

a sixth switch, turned on in the integration phase to couple the second terminal of the first feedback capacitor to the second terminal of the second feedback capacitor.

10. The analog-to-digital converter as claimed in claim 9, comprising:

a fourth connection swap circuit, outputting a signal of the first terminal of the first feedback capacitor to form the first feedback amount and outputting a signal of the first terminal of the second feedback capacitor to form the second feedback amount when the signal at the output terminal of the comparator is at the first state, and outputting the signal of the first terminal of the second feedback capacitor to form the first feedback amount and outputting the signal of the first feedback capacitor as the second feedback amount when the signal at the output terminal of the comparator is at the second state.

11. A modulation unit, comprising:

a first input capacitor and a second input capacitor, sampling a first input signal and a second input signal of the modulation unit in a swapping manner;

an operational amplifier, having a first input terminal, a second input terminal, a first output terminal and a second output terminal, wherein the first and second output terminals are operative to output a first output signal and a second output signal of the modulation unit, respectively;

a first integration capacitor coupled between the first input terminal and the first output terminal of the operational amplifier, and a second integration capacitor coupled between the second input terminal and the second output terminal of the operational amplifier, wherein the first and second integration capacitors are coupled to the first and second input capacitors in a swapping manner; and a feedback control circuit, generating a first feedback amount and a second feedback amount to be coupled to the first integration capacitor and the second integration capacitor in a swapping manner.

12. The modulation unit of claim 11, wherein the feedback control circuit is directed by a digital signal from a comparator for controlling the first and second feedback amounts, the comparator having a non-inverted input terminal and an inverted input terminal coupled to first and second output signals of a delta-sigma modulation unit, respectively, and further having an output terminal operative to output the digital signal.

13. The modulation unit of claim 12, wherein the feedback control circuit comprises:

a first feedback capacitor and a second feedback capacitor, sampling a reference voltage and the second input signal in a swapping manner, wherein when a signal at the output terminal of the comparator is at a first state, the first and second feedback capacitors are used to provide the first feedback amount and the second feedback amount, respectively, and, when the signal at the output terminal of the comparator is at a second state, the first and second feedback capacitors are used to offer the second feedback amount and the first feedback amount, respectively.

14. The modulation unit of claim 13, comprising:

a first switch and a second switch, turned on in an input phase to couple a first terminal of the first input capacitor to a common mode voltage node and couple a first terminal of the second input capacitor to the common mode voltage node; and a first connection swap circuit, coupling the first input signal to a second terminal of the first input capacitor and coupling the second input signal to a second terminal of the second input capacitor in a first half-frequency phase of the input phase, and coupling the first input signal to the second terminal of the second input capacitor and coupling the second input signal to the second terminal of the first input capacitor in a second half-frequency phase of the input phase.

15. The modulation unit of claim 14, wherein the first connection swap circuit comprises:

a first connection swap switch, turned on in the first half-frequency phase of the input phase to couple the first input signal to the second terminal of the first input capacitor;

a second connection swap switch, turned on in the second half-frequency phase of the input phase to couple the first input signal to the second terminal of the second input capacitor;

a third connection swap switch, turned on in the second half-frequency phase of the input phase to couple the second input signal to the second terminal of the first input capacitor; and a fourth connection swap switch, turned on in the first half-frequency phase of the input phase to couple the second input signal to the second terminal of the second input capacitor.

16. The modulation unit of claim 14, comprising:

a third switch, turned on in an integration phase to couple the second terminal of the first input capacitor to the second terminal of the second input capacitor; and a second connection swap circuit, coupling the first terminal of the first input capacitor to the first input terminal of the operational amplifier and coupling the first terminal of the second input capacitor to the second input terminal of the operational amplifier in a first half-frequency phase of the integration phase, and coupling the first terminal of the first input capacitor to the second input terminal of the operational amplifier and coupling the first terminal of the second input capacitor to the first input terminal of the operational amplifier in a second half-frequency phase of the integration phase.

17. The modulation unit of claim 16, wherein the second connection swap circuit comprises:

a first connection swap switch, turned on in the first half-frequency phase of the integration phase to couple the first terminal of the first input capacitor to the first input terminal of the operational amplifier;

a second connection swap switch, turned on in the second half-frequency phase of the integration phase to couple the first terminal of the first input capacitor to the second terminal of the operational amplifier;

a third connection swap switch, turned on in the second half-frequency phase of the integration phase to couple the first terminal of the second input capacitor to the first input terminal of the operational amplifier; and a fourth connection swap switch, turned on in the first half-frequency phase of the integration phase to couple the first terminal of the second input capacitor to the second input terminal of the operational amplifier.

18. The modulation unit of claim 16, comprising:
a fourth switch and a fifth switch, turned on in the input phase to couple a first terminal of the first feedback capacitor to the common mode voltage node and couple a first terminal of the second feedback capacitor to the common mode voltage node; and
a third connection swap circuit, coupling the reference voltage to a second terminal of the first feedback capacitor and coupling the second input signal to a second terminal of the second feedback capacitor in the first half-frequency phase of the input phase, and coupling the reference voltage to the second terminal of the second feedback capacitor and coupling the second input signal to the second terminal of the first feedback capacitor in the second half-frequency phase of the input phase.

19. The modulation unit of claim 18, wherein the third connection swap circuit comprises:
a first connection swap switch, turned on in the first half-frequency phase of the input phase to couple the reference voltage to the second terminal of the first feedback capacitor;
a second connection swap switch, turned on in the second half-frequency phase of the input phase to couple the reference voltage to the second terminal of the second feedback capacitor;
a third connection swap switch, turned on in the second half-frequency phase of the input phase to couple the second input signal to the second terminal of the first feedback capacitor; and
a fourth connection swap switch, turned on in the first half-frequency phase of the input phase to couple the second input signal to the second terminal of the second feedback capacitor.

20. The modulation unit of claim 18, comprising:
a sixth switch, turned on in the integration phase to couple the second terminal of the first feedback capacitor to the second terminal of the second feedback capacitor;
a fourth connection swap circuit, outputting a signal of the first terminal of the first feedback capacitor to form the first feedback amount and outputting a signal of the first terminal of the second feedback capacitor to form the second feedback amount when the signal at the output terminal of the comparator is at the first state, and outputting the signal of the first terminal of the second feedback capacitor to form the first feedback amount and outputting the signal of the first feedback capacitor as the second feedback amount when the signal at the output terminal of the comparator is at the second state.

* * * * *